United States Patent [19]

Cuppen et al.

[11] Patent Number: 5,262,725
[45] Date of Patent: Nov. 16, 1993

[54] MAGNETIC RESONANCE IMAGING METHOD AND DEVICE FOR REDUCING IMAGE ERRORS IN A MAGNETIC RESONANCE IMAGE

[75] Inventors: Johannes J. M. Cuppen; Miha Fuderer; Antoon F. Mehlkope; Michaël J. Duijvestijn; Gerrit H. Van Yperen, all of Eindhoven, Netherlands

[73] Assignee: U.S. Philips Corp., New York, N.Y.

[21] Appl. No.: 811,560

[22] Filed: Dec. 20, 1991

[30] Foreign Application Priority Data

Dec. 21, 1990 [NL] Netherlands .......................... 9002842

[51] Int. Cl.⁵ ........................................... G01R 33/20
[52] U.S. Cl. ...................................... 324/312; 324/309
[58] Field of Search ............... 324/300, 307, 308, 309, 324/310, 311, 312, 313, 314, 318, 322; 128/653.5; 335/299

[56] References Cited

U.S. PATENT DOCUMENTS

| | | | |
|---|---|---|---|
| 4,706,026 | 11/1987 | Pelc | 324/309 |
| 4,818,940 | 4/1989 | Henning et al. | 324/309 |
| 4,979,512 | 12/1990 | Heubes | 128/653 |
| 5,087,880 | 2/1992 | Bruder et al. | 324/309 |
| 5,126,673 | 6/1992 | Henning | 324/309 |

FOREIGN PATENT DOCUMENTS 0212526 11/1986 European Pat. Off. .
245037 2/1990 Japan .

OTHER PUBLICATIONS

"An Algorithm for Translational Motion Artifact Correction", Hedley et al. SMRM, Aug. 18-24, 1990, p. 561.

Primary Examiner—Michael J. Tokar
Attorney, Agent, or Firm—Jack D. Slobod

[57] ABSTRACT

In magnetic resonance imaging various error sources lead to deterioration of the image quality. One class of errors is formed by errors which vary only slowly over the time required to sample a data line but vary substantially over the time required to acquire data for the complete magnetic resonance image. These error sources are, for example external magnetic fields, motion due to respiration, drift in amplifiers or drift phenomena in permanent magnets due to temperature influences. It is proposed to utilize mutually intersecting data lines in the Fourier domain so as to estimate these error sources and to use these estimates to correct the data sets obtained before execution of image reconstruction.

16 Claims, 13 Drawing Sheets $$S_A(k_x, k_y) = S_0(k_x, k_y) \exp\left(\frac{2\pi i}{n_s}(k_x \delta_x^A(k_y) + k_y \delta_y^A(k_x))\right) \quad (1)$$

$$S_B(k_x, k_y) = S_0(k_x, k_y) \exp\left(\frac{2\pi i}{n_s}(k_x \delta_x^B(k_y) + k_y \delta_y^B(k_x))\right) \quad (2)$$

$$\exp\left[\frac{2\pi i}{n_s}\left(k_x \delta_x^B(k_x) + k_y \delta_y^B(k_x) - k_x \delta_x^A(k_y) - k_y \delta_y^A(k_y)\right)\right] = \frac{S_B(k_x, k_y) S_A^*(k_x, k_y)}{\|S_B(k_x, k_y) S_A^*(k_x, k_y)\|} \quad (3)$$

$$k_x \delta_x^B(k_x) + k_y \delta_y^B(k_x) - k_x \delta_x^A(k_y) - k_y \delta_y^A(k_y) \approx \frac{\operatorname{Im}(S_B(k_x, k_y) S_A^*(k_x, k_y))}{\|S_B(k_x, k_y) S_A^*(k_x, k_y)\|} \cdot \frac{n_s}{2\pi} \quad (4)$$

$$H_x(k_x, k_y) = \frac{k_x}{k_x^2 + \epsilon} \cdot \frac{\operatorname{Im}(S_B(k_x, k_y) S_A^*(k_x, k_y))}{\|S_B(k_x, k_y) S_A^*(k_x, k_y)\|} \cdot \frac{n_s}{2\pi} \quad (5)$$

$$H_y(k_x, k_y) = \frac{k_y}{k_y^2 + \epsilon} \cdot \frac{\operatorname{Im}(S_B(k_x, k_y) S_A^*(k_x, k_y))}{\|S_B(k_x, k_y) S_A^*(k_x, k_y)\|} \cdot \frac{n_s}{2\pi}, \quad (6)$$

FIG. 2c $$\bar{\delta}_x^A(k_y) = -\frac{1}{n_s}\sum_{k_x} H_x(k_x, k_y) \quad (7)$$

$$\bar{\delta}_y^A(k_y) = -\frac{1}{n_s}\sum_{k_x} H_y(k_x, k_y) \quad (8)$$

$$\bar{\delta}_x^B(k_x) = \frac{1}{n_s}\sum_{k_y} H_x(k_x, k_y) \quad (9)$$

$$\bar{\delta}_y^B(k_x) = \frac{1}{n_s}\sum_{k_y} H_y(k_x, k_y) \quad (10)$$

$$\sum_{k_x} H_x(k_x, k_y) \approx \sum_{k_x} \frac{k_x k_x}{k_x^2 + \epsilon} \delta_x^B(k_x) - \sum_{k_x} \frac{k_x k_x}{k_x^2 + \epsilon} \delta_x^B(k_x) + \sum_{k_x} \frac{k_x k_x}{k_x^2 + \epsilon} \delta_x^A(k_y) + \sum_{k_x} \frac{k_x k_y}{k_x^2 + \epsilon} \delta_y^B(k_x) - \sum_{k_x} \frac{k_x k_y}{k_x^2 + \epsilon} \delta_y^A(k_y) \quad (11)$$

$$\sum_{k_x} H_x(k_x, k_y) \approx \sum_{k_x} \delta_x^B(k_x) - n_s \delta_x^A(k_y) + k_y \sum_{k_x} \frac{k_x}{k_x^2 + 1} \delta_y^B(k_x) - k_y \delta_y^A(k_y) \cdot 0 \quad (12)$$

FIG.2c $$\sum_{k_x} H_x(k_x, k_y) \approx -n_s \tilde{\delta}_x^A(k_y). \quad (13)$$

$$S_A^{(1)}(k_x, k_y) = S_A(k_x, k_y) \exp\left(-\frac{2\pi i}{n_s}(k_x \tilde{\delta}_x^A(k_y) + k_y \tilde{\delta}_y^A(k_y))\right) \quad (14)$$

$$S_B^{(1)}(k_x, k_y) = S_B(k_x, k_y) \exp\left(-\frac{2\pi i}{n_s}(k_x \tilde{\delta}_x^B(k_y) + k_y \tilde{\delta}_y^B(k_y))\right) \quad (15)$$

$$\tilde{\delta}_x^A(k_y) = -\frac{\sum_{k_x} H_x(k_x, k_y) w(k_x, k_y)}{\sum_{k_x} w(k_x, k_y)}, \quad (16)$$

$$w(k_x, k_y) = \frac{\|S_B(k_x, k_y) S_A^*(k_x, k_y)\|^2}{\|S_B(k_x, k_y) S_A^*(k_x, k_y)\|^2 + N^2}, \quad (17)$$

FIG.2c $$S_0(k_x, k_y) = \int\int p_0(x,y) \exp\left(\frac{2\pi i}{n_s}(xk_x + yk_y)\right) dx\, dy \qquad (18)$$

$$S_A(k_x, k_y) = \int\int p_0(x,y) \exp\left(\frac{2\pi i}{n_s} y c^A(k_y) k_y\right) \exp\left(\frac{2\pi i}{n_s}(xk_x + yk_y)\right) dx\, dy \qquad (19)$$

$$S_A(k_x, k_y) \approx \int\int p_0(x,y)\left(1 + \frac{2\pi i}{n_s} y c^A(k_y) k_y\right) \exp\left(\frac{2\pi i}{n_s}(xk_x + yk_y)\right) dx\, dy \qquad (20)$$

$$S_A(k_x, k_y) \approx S_0(k_x, k_y) + i c^A(k_y) k_y \left(S_0(k_x, k_y) \otimes G(k_y)\right). \qquad (21)$$

$$G(k_y) = \begin{cases} \dfrac{i}{k_y} & k_y \neq 0 \\ 0 & k_y = 0 \end{cases}. \qquad (22)$$

$$S_B(k_x, k_y) \approx S_0(k_x, k_y) + i c^B(k_x) k_y \left(S_0(k_x, k_y) \otimes G(k_y)\right). \qquad (23)$$

FIG.2d $$H(k_x, k_y) = \frac{\text{Im}\left[(S_A(k_x,k_y) - S_B(k_x,k_y))(\bar{S}_0(k_x,k_y) \otimes G(k_y))^*\right]}{\|\bar{S}_0(k_x,k_y) \otimes G(k_y)\|^2} \cdot \frac{k_y}{k_y^2 + \epsilon} \quad (24)$$

$$H(k_x, k_y) \approx c^A(k_y) - c^B(k_x). \quad (25)$$

$$\bar{c}^A(k_y) = \frac{1}{n_s} \sum_{k_x} H(k_x, k_y) \quad (26)$$

$$\bar{c}^B(k_x) = -\frac{1}{n_s} \sum_{k_y} H(k_x, k_y). \quad (27)$$

FIG. 2d $$\tilde{S}_0 = (S_A + S_B)/2 \quad (28)$$

$$w(k_x, k_y) = \frac{\|\tilde{S}_0(k_x, k_y) \otimes G(k_y)\|^2}{\|\tilde{S}_0(k_x, k_y) \otimes G(k_y)\|^2 + N^2} \quad (29)$$

$$= \quad (30)$$

$$\tilde{c}^A(k_y) = \frac{\sum_{k_x} H(k_x, k_y) w(k_x, k_y)}{\sum_{k_x} w(k_x, k_y)} \quad (31)$$

$$\tilde{c}^B(k_x) = \frac{\sum_{k_y} H(k_x, k_y) w(k_x, k_y)}{\sum_{k_y} w(k_x, k_y)} \quad (32)$$

$$\tilde{S}_A(k_x, k_y) = S_A(k_x, k_y) - i\tilde{c}^A(k_y) k_y \left( \tilde{S}_0(k_x, k_y) \otimes G(k_y) \right) \quad (33)$$

$$\tilde{S}_B(k_x, k_y) = S_B(k_x, k_y) - i\tilde{c}^B(k_x) k_y \left( \tilde{S}_0(k_x, k_y) \otimes G(k_y) \right). \quad (34)$$

FIG.2d

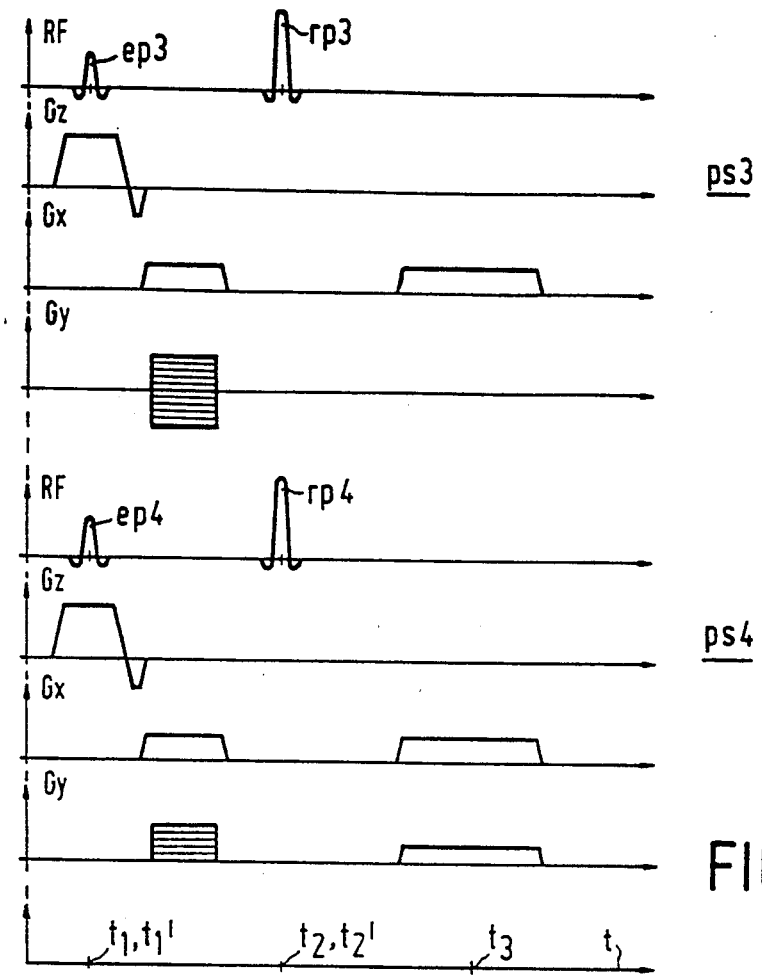
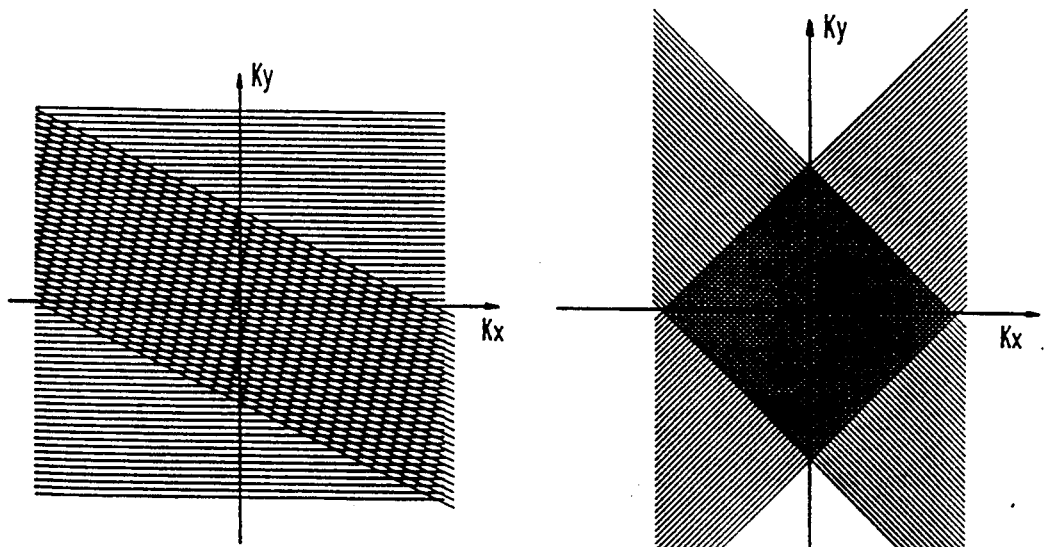
FIG.3a
FIG.3b
FIG.3c $$S_A(k_x, k_y) = S_0(k_x, k_y) \exp\left(i\phi_A(k_y)\left(1 + \frac{k_x}{N_x}\frac{t_{acq}}{T_E}\right)\right) \approx S_0(k_x, k_y)e^{i\phi_A(k_y)} \quad (35)$$

$$S_B(k_B) = S_0(k_x, k_y) \exp\left(i\phi_B\left(1 + \frac{k_x}{N_x}\frac{t_{acq}}{T_E}\right)\right) \approx S_0(k_B, k_B)e^{i\phi_B} \quad (36)$$

$$\tilde{\phi}_B = \arg(S_B(0)). \quad (37)$$

$$\tilde{S}_B(k_B) = S_B(k_B)e^{-i\tilde{\phi}_B}. \quad (38)$$

$$\tilde{\phi}_A(k_y) = \arg[S_A(k_y, k_y)] - \arg[\tilde{S}_B(k_y)], \quad (39)$$

$$\tilde{S}_A(k_x, k_y) = S_A(k_x, k_y)e^{-i\tilde{\phi}_A(k_y)} \quad (40)$$

FIG. 4C $$S_A(k_x, k_y, k_z) \approx S_0(k_x, k_y, k_z)e^{i\phi_A(k_y,k_z)} \quad (41)$$

$$S_B(k_B, k_B, k_z) \approx S_0(k_B, k_B, k_z)e^{i\phi_B(k_z)} \quad (42)$$

$$S_C(k_C, k_C, k_C) \approx S_0(k_C, k_C, k_C)e^{i\phi_C} \quad (43)$$

$$\bar{\phi}_C = \arg[S_C(0)] \quad (44)$$

$$\tilde{S}_C(k_C, k_C, k_C) = S_0(k_C, k_C, k_C)e^{-i\bar{\phi}_C} \quad (45)$$

$$\bar{\phi}_B(k_z) = \arg[S_B(k_z, k_z, k_z)] - \arg[\tilde{S}_C(k_z, k_z, k_z)] \quad (46)$$

$$\tilde{S}_B(k_B, k_B, k_z) = S_0(k_B, k_B, k_z)e^{-i\bar{\phi}_B(k_z)} \quad (47)$$

$$\bar{\phi}_A(k_y, k_z) = \arg[S_A(k_y, k_y, k_z)] - \arg[\tilde{S}_B(k_y, k_y, k_z)] \quad (48)$$

$$\tilde{S}_A(k_x, k_y, k_z) = S_0(k_x, k_y, k_z)e^{-i\bar{\phi}_A(k_y,k_z)} \quad (49)$$

FIG.5b

MAGNETIC RESONANCE IMAGING METHOD AND DEVICE FOR REDUCING IMAGE ERRORS IN A MAGNETIC RESONANCE IMAGE

BACKGROUND OF THE INVENTION

1. Field of the Invention

The invention relates to a magnetic resonance imaging method for reducing image errors in a magnetic resonance image formed from magnetic resonance signals from an object arranged in a steady magnetic field. The invention also relates to a magnetic resonance imaging device for reducing image errors in a magnetic resonance image formed from magnetic resonance signals from an object arranged in a steady magnetic field, which device comprises means for generating the steady field, means for generating RF electromagnetic pulses, and means for generating gradient magnetic fields superposed on the steady field.

2. Description of the Related Art

A magnetic resonance imaging method and device of the kind set forth are known from European Patent Application No. 0 212 526 which corresponds to U.S. Pat. No. 4,706,026, issued Nov. 10, 1987. The cited Application discloses a method of reducing image errors in magnetic resonance imaging, which errors are caused by periodic motion of the object, for example due to respiration. When magnetic resonance signals are acquired in known manner, for example by means of a so-called spin-warp sequence as disclosed in EP 0 212 526, during periodic motion of the object, image errors such as ghost errors and blurring occur in a magnetic resonance image derived from signal samples of the resonance signals. EP 0 212 526 also describes how such image errors can be reduced by selecting, in a pulse and gradient sequence, amplitudes of a phase encoding gradient in the pulse and gradient sequence in accordance with a predetermined diagram. Thus, EP 0 212 526 aims to reduce image errors which are caused essentially by a periodic variation of the magnetic resonance signals received. However, other sources of image errors also exist, for example varying external magnetic fields which disturb the steady magnetic field. These external fields may be caused by moving elevators in the vicinity of the MRI equipment, passing street cars or trains, etc. This means that the steady magnetic field fluctuates. Ultimately, after image reconstruction, the magnetic field disturbances will also give rise to image errors in the magnetic resonance image. Rigid motions of the object, without involving deformation of the object as occurring during respiration, also give rise to image errors. Furthermore, when the steady field is generated by means of a permanent magnet, drift phenomena could occur in the steady field due to temperature fluctuations. Slow drift phenomena of amplifiers in the transmission/receiving chain or of gradient amplifiers may cause similar problems.

SUMMARY OF THE INVENTION

It is an object of the invention to provide a method which reduces image errors in a magnetic resonance image which are caused by a significant class of image error sources, for example rigid motion of the object and deformation of the object during signal acquisition, influencing of the steady field by external fields during signal acquisition, and instrumental drift phenomena.

To achieve this, a magnetic resonance imaging method in accordance with the invention is characterized in that magnetic resonance signals are acquired by means of at least first and second pulse and gradient sequences, signal samples thereof being stored in at least a first and a second data set, data lines of the respective data sets intersecting one another in the frequency domain, and that from a combination of data of the intersecting data lines estimates for image error sources are determined, after which either on the basis of the estimates determined the data of the data lines in at least one of the data sets is corrected, after which the magnetic resonance image is determined from the corrected data set by means of an integral transformation or, using a Fourier transformation, a third data set is determined from one of the data sets and a fourth data set is determined from the estimates, after which the magnetic resonance image is determined by convolution of the third with the fourth data set.

The invention utilizes the fact that different image error sources are at least reasonably constant during acquisition of data of a data line in the frequency or Fourier domain, or that a model of the image error source can be formed. In practice the signal sampling of a data line requires approximately 15 ms or less. This means that the effect of an image error source can be described by way of one or a few scalar parameters. The method in accordance with the invention is based on the estimation of these parameters and on the correction of image errors in the magnetic resonance image on the basis thereof. The intersecting lines of the first and the second data set provide information as regards data line errors on the basis of which image correction is performed. The correction is preferably performed prior to the integral transformation but, when the transformation is a linear transformation such as a Fourier transformation, it can also be performed after the transformation on the basis of the convolution theorem then applicable. In the latter case first two multi-dimensional Fourier transformations are executed on the non-corrected data and on estimates of error sources, the third and the fourth data set being formed so as to derive the corrected image therefrom by convolution. A method is provided enabling correction of image errors which are due to various image error sources, without requiring the use of physiological sensors such as sensors for, for example respiratory motion or sensors for the measurement of other image error sources such as external fields.

It is to be noted that Japanese Kokai No. 2-45035 describes a method utilizing sensors for measuring a magnetic field in order to measure fluctuations of the field outside the MRI equipment and to generate an appropriate compensating field on the basis thereof by means of a separate coil in the MRI apparatus. This method, therefore, requires additional hardware in comparison with standard MRI equipment.

It is also to be noted that on page 561 of the Book of Abstracts, Society of Magnetic Resonance in Medicine, Aug. 18-24, 1990, New York, the article "An Algorithm for Translational Motion Artifact Correction" a method is described for correcting the image in the case of rigid motion of an object, which method is based on post-processing applied to a single image. Assuming that the motion of the object is sufficiently slow during acquisition of data of a data line, phase errors caused by object shift are estimated from the amplitude of the signals under the a priori assumption that the object has finite dimensions.

A version of a method in accordance with the invention which is particularly suitable for the reduction of image errors in a magnetic resonance image which are caused by rigid and non-rigid motion is characterized in that the first pulse and gradient sequence comprises an excitation pulse, a phase encoding gradient and a read-out gradient whose gradient directions do not coincide, the second pulse and gradient sequence, also comprising an excitation pulse, a phase encoding gradient and a read-out gradient, deviating from the first pulse and gradient sequence at least in that the phase encoding gradient and the read-out gradient have been interchanged. A grid of mutually intersecting data lines is thus obtained in the frequency domain, the so-called k-plane, on which the signal samples of the complex (amplitude, phase) magnetic resonance signals are mapped. A multi-dimensional integral transformation, for example a Fourier transformation, applied to the data stored in one of the data sets results in a magnetic resonance distribution of the object which can be displayed on a display screen, for example, as a grey scale image. In accordance with the invention, the data lines are encoded by selection of the phase encoding gradients so that a sample i of a data line j in the first data set corresponds to a sample j of a data line i of the second data set. From a resultant number of equations containing unknowns, including the image errors, estimates are determined for the image errors, the data in one of the data sets being corrected by means of said estimates.

A further version of a method in accordance with the invention which is particularly suitable for reducing image errors caused by rigid motion is characterized in that phase differences of data of the points of intersection of the data lines are used as the combination of data, object shifts associated with data lines being determined from said combination as estimates of the image error sources. In this respect it is assumed that the object does not move during acquisition of data of one data line. Without motion the data at the intersections in the k-space would be equal, but motion causes a shift of the data lines so that the data at corresponding grid points is no longer equal. Using the estimates, the data is corrected so that corresponding data of the data sets becomes equal. Reconstruction of an image from one of the corrected data sets or from a combination thereof produces an image containing substantially fewer image errors.

A further version of a method in accordance with the invention which is particularly suitable for reducing image errors caused by non-rigid motion, for example motion due to respiration, is characterized in that phase differences of data of the points of intersection of the data lines are used as the combination of data, stretching factors of the object being derived from said combination as estimates of the image error sources. In this version it is assumed that the motion is mainly anterior-posterior and can be modelled as a linear stretching or compression of the object, i.e. under the influence of motion tissue is displaced over a distance c.y (for example, in the y-direction), where c is a stretching factor which differs from one data line to another. Correction is again executed on the basis of two "mutually perpendicular" data sets.

In said versions presaturation on water or fat can be realised in known manner. In that case an image is obtained which contains even fewer image errors.

A version of a method in accordance with the invention which is less susceptible to field inhomogeneities of the steady field is characterized in that the first pulse and gradient sequence comprises an excitation pulse, a phase encoding gradient and a read-out gradient whose gradient directions do not coincide, the second pulse and gradient sequence, also comprising an excitation pulse, a phase encoding gradient and a read-out gradient, deviating from the first pulse and gradient sequence at least in that the second pulse and gradient sequence comprises an additional phase encoding gradient which is applied simultaneously with the read-out gradient. Should field inhomogeneities of the steady field and chemical shifts in an object containing different components such as water and fat or also other components cause differences in resonance of the resonance signals of the first and the second data set, differences will occur in the sampling time of corresponding samples. These time differences are eliminated by keeping the time elapsing between excitation and sampling constant for all corresponding samples for all data lines of the data sets.

Another version of a method in accordance with the invention which also eliminates said time differences is characterized in that the first pulse and gradient sequence comprises an excitation pulse, a phase encoding gradient and a read-out gradient whose gradient directions do not coincide, the second pulse and gradient sequence, also comprising an excitation pulse, a phase encoding gradient and a read-out gradient, deviating from the first pulse and gradient sequence at least in that an additional gradient is superposed on the phase encoding gradient of the first pulse and gradient sequence, which additional gradient is also applied during the read-out gradient, on the phase encoding gradient of the second pulse and gradient sequence there being superposed the opposed additional gradient which is also applied during the read-out gradient.

The estimates can be iteratively determined in said versions.

A version of a method in accordance with the invention which is particularly suitable to reduce image errors due to external fields is characterized in that the first pulse and gradient sequence comprises an excitation pulse, a phase encoding gradient and a read-out gradient whose gradient directions do not coincide, the second pulse and gradient sequence, also comprising an excitation pulse and a read-out gradient, deviating from the first pulse and gradient sequence at least in that a further gradient coincident with the read-out gradient is applied with a gradient direction which deviates from that of the read-out gradient, and that in the case of three-dimensional imaging further phase encoding gradients are applied in the first and the second pulse and gradient sequences, a third pulse and gradient sequence being applied in order to obtain a third data set for estimation and correction, which third pulse and gradient sequence comprises an excitation pulse and three gradients which are active during the reading out of the magnetic resonance signal and whose gradient directions do not coincide. Assuming that the steady field is reasonably constant during acquisition of data of one data line, the image error can be modelled as a phase error which linearly increases over the data line. If the acquisition time of a data line is short in comparison with the echo time, as in a so-called gradient-echo method where field disturbances have a comparatively strong effect on the image, the image error can even be modelled as a constant phase shift over the data line. Image error reduction in a data set can then be performed on the basis of a data set comprising one or a few data lines in a two-dimensional case, and in a three-dimensional case it can be performed on the basis of data sets comprising substantially fewer data lines than the data set to be corrected.

Versions of methods in accordance with the invention which are suitable to reduce image errors due to external fields and which utilize said phase estimation may be very simple. In a two-dimensional case, the data set to be used for correction may comprise only one data line. In order to achieve improvement as regards noise effects, the correction data set may comprise a few data lines and a mean value can be taken so as to estimate the phase errors.

In all versions the estimates can be weighted in respect of noise in order to improve the image quality.

BRIEF DESCRIPTION OF THE DRAWING

The invention will be described in detail hereinafter with reference to a drawing; therein:

FIG. 3A shows a further version of pulse and gradient sequences of a method in accordance with the invention, FIG.3B shows intersecting data lines in the k-space, associated with the sequences shown in FIG. 3A, FIG. 3C shows intersecting data lines in the k-space, associated with another version of a method in accordance with the invention, FIG. 4C shows formulae for a version in accordance with FIG. 4A, FIG. 5B shows formulae for a version according to FIG. 5A.

DETAILED DESCRIPTION OF THE PREFERRED EMBODIMENTS

Figure 1:
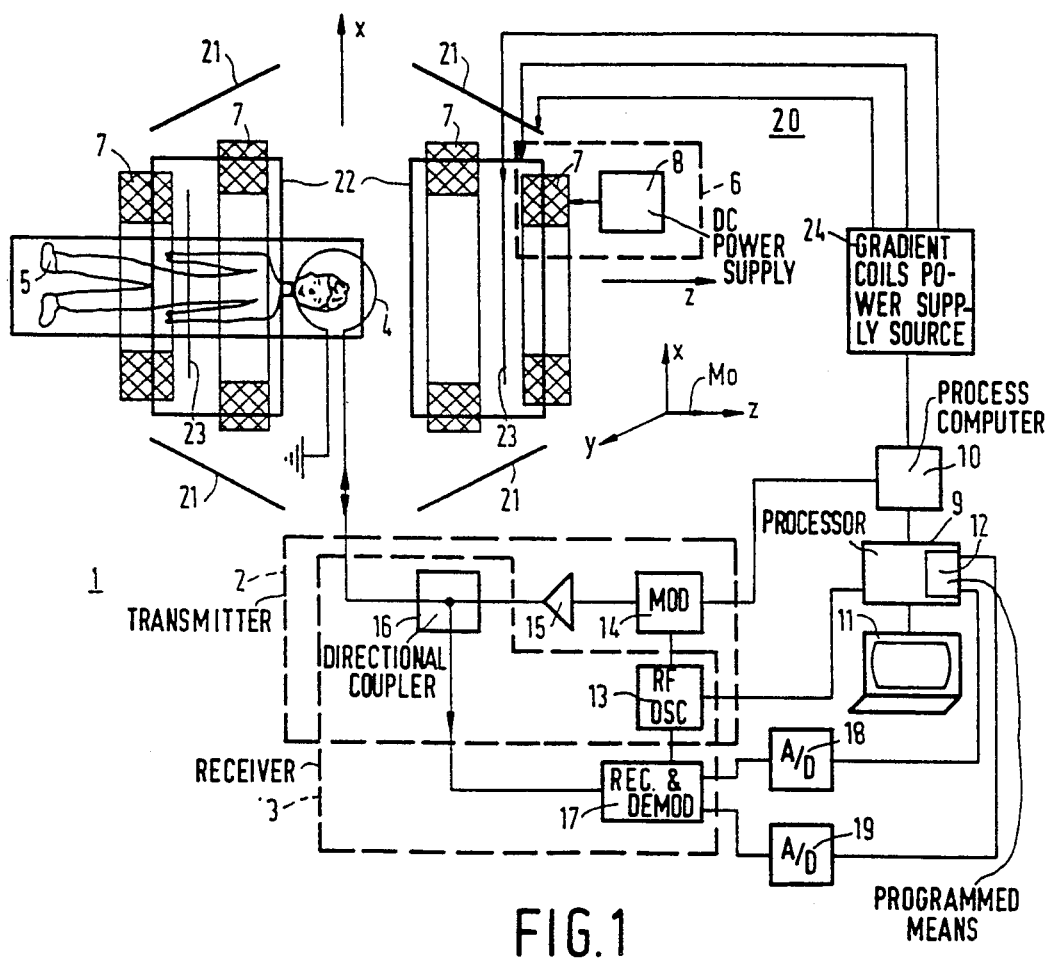
FIG. 1 shows diagrammatically a magnetic resonance imaging device in accordance with the invention.

FIG. 1 shows diagrammatically a magnetic resonance imaging device 1 in accordance with the invention, comprising transmitter means 2 and receiver means 3 for transmitting RF electromagnetic pulses to an object 5, via a transmitter/receiver coil 4, and for receiving magnetic resonance signals, respectively, which are generated by the RF electromagnetic pulses in the object 5 which is situated in a steady, uniform magnetic field. The transmitter/receiver coil may be a single coil, but a separate transmitter coil and a separate coil may alternatively be provided. The device 1 comprises means 6 for generating the steady field. The means 6 comprise magnet coils 7 and, in the case of resistive magnets or superconducting magnets, it also comprises a DC power supply source 8. In the case of a permanent magnet, the DC power supply source 8 is absent. During operation of the device 1, the object being arranged within the magnet coils 7, a slight excess of nuclear spins (of nuclei having a magnetic moment) will be directed in the direction of the steady field in the state of equilibrium. From a macroscopic point of view this is to be considered as a magnetization $M_o$, being an equilibrium magnetization. The device 1 also comprises processing means 9 which are coupled to the transmitter means 2 and the receiver means 3, a process computer 10 which is coupled to the processing means 9 and the transmitter means, and display means 11 for displaying a nuclear magnetization distribution which is determined from resonance signals, received by the receiving means 3 and demodulated, after signal sampling thereof (detection of resonance signals). More specifically, the transmitter means 2 comprise an RF oscillator 13 for generating a carrier signal, a modulator 14 for amplitude and/or phase and frequency modulation of the carrier signal, a power amplifier 15 and a directional coupler 16 which is coupled to the transmitter/receiver coil 4. The RF oscillator 13 is coupled to the processing means 9 and the modulator 14 is coupled to the process computer 10. When excitation pulses are applied to the object 5, under the control of the programmed means 12 and via the transmitter means 2, with a frequency contents in the vicinity of the so-called Larmor frequency of, for example protons, magnetic resonance signals will be produced wherefrom a proton nuclear spin distribution can be determined by the programmed means 12 by way of, for example Fourier transformation. The receiver means 3 for receiving the resonance signals comprise the directional coupler 16 and a receiving and demodulation unit 17. The unit 17 may be a double phase-sensitive detector, whose output signals are sampled by way of a first and a second analog-to-digital converter 18, 19, respectively. The A/D converters 18 and 19 are coupled to the processing means 9. The transmitter means 2 and the receiver means 3 can alternatively be formed by a so-called phase-coherent digital transmitter/receiver. The device 1 also comprises means 20 for generating magnetic field gradients which are superposed on the steady, uniform field. The means 20 comprise gradient magnet coils 21, 22 and 23 for generating magnetic field gradients $G_x$, $G_y$ and $G_z$, respectively, and a power supply source 24 which can be activated by the process computer 10 and which serves to power the gradient magnet coils 21, 22 and 23 which are separately activatable. In the embodiment shown, the arrangement in space of the gradient magnet coils is such that the field direction of the magnetic field gradients coincides with the direction of the steady, uniform magnetic field and that the gradient directions extend perpendicularly to one another as indicated by three mutually perpendicular axes x, y and z in FIG. 1. The magnetic resonance signals wherefrom a nuclear spin distribution can be reconstructed by Fourier transformation are obtained by means of so-called pulse and gradient sequences.

Figure 2A:
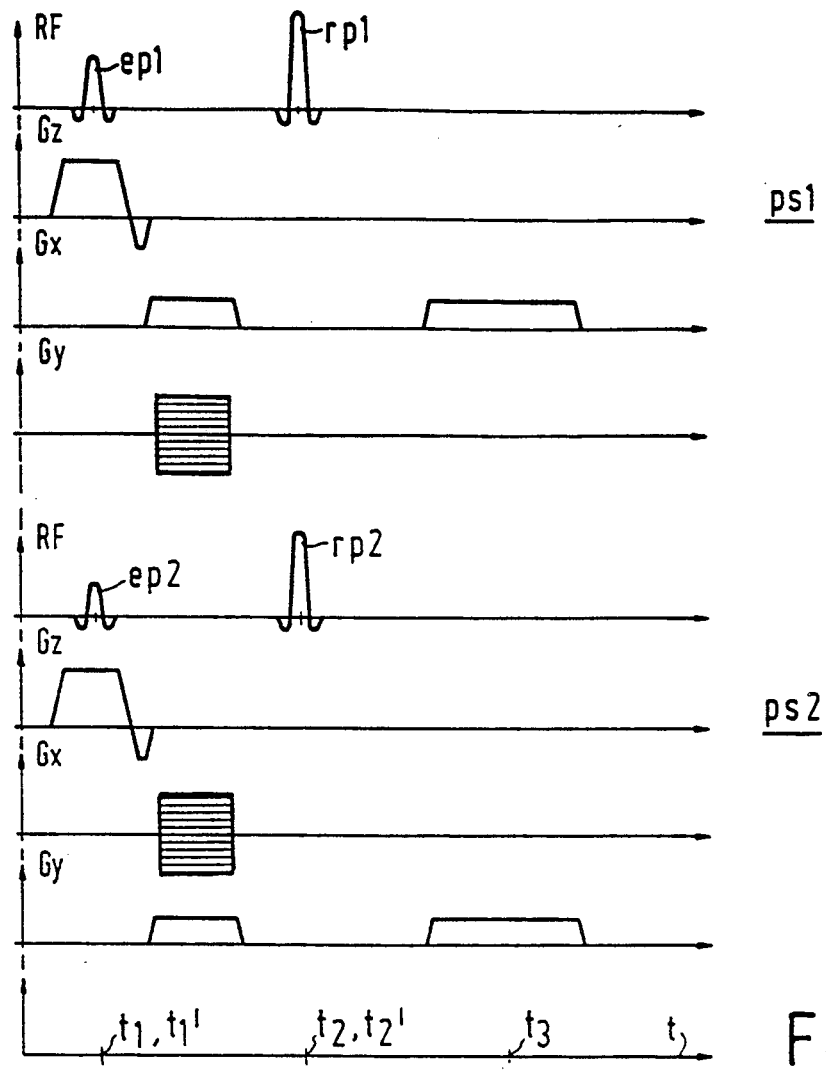
FIG. 2A shows pulse and gradient sequences of a version of a method in accordance with the invention, FIG. 2B shoows intersecting data lines in the k-space, associated with the sequences shown in FIG. 2A.

FIG. 2A shows pulse and gradient sequences of a version of a method in accordance with the invention. According to the method, a first so-called spin-echo pulse and gradient sequence ps1 is applied to the object 5 as a function of time t. The pulse and gradient sequence ps1 comprises an excitation pulse ep1 which is applied, by way of the transmitter means 2, to the object 5 at the instant $t=t1$, via the transmitter/receiver coil 4, in order to excite nuclear spins in the object 5, and also comprises a refocusing pulse rp1 which is applied at the instant t=t2 in order to refocus dephased nuclear magnetization. At the instant t=t3, the receiver means 3 receive a magnetic resonance signal which originates from the object 5 and which is detected by the transmitter/receiver coil 4. During application of the RF electromagnetic excitation pulse, an magnetic field gradient $G_z$ is active for selection of a slice of the object, i.e. the magnetic resonance signals selectively originate from a slice of the object 5. Furthermore, between the pulses ep1 and rp1 a phase encoding gradient $G_y$ is applied for phase encoding of the nuclear spins, a read-out gradient $G_x$ being applied during the reading out of the magnetic resonance signal for frequency encoding of the nuclear spins. The gradients $G_x$, $G_y$ and $G_z$ are superposed on the steady field via the gradient magnet coils 21, 22 and 23. The sequence ps1 is repeated a number of times for different values of the phase encoding gradient $G_y$, for example 256 times. For each value of $G_y$ a magnetic resonance signal is obtained which is received in the receiving and demodulation unit 17, is demodulated and is applied in the form of samples, via A/D converters 18 and 19, to the processing means 9 for storage in a first data set. For each $G_y$ a data line in the k-space is filled. Using the programmed means 12, a nuclear magnetization distribution can be reconstructed from the data set by way of a Fourier transformation, distribution can be displayed in the form of a magnetic resonance image by means of the display means 11. In accordance with the invention there is applied a second pulse and gradient sequence ps2 which comprises an excitation pulse ep2 at the instant t=t1', a refocusing pulse rp2 at the instant t=t2', and a selection gradient $G_z$, and further gradients $G_x$ and $G_y$ which have been interchanged with respect to the first sequence ps1. This results in data lines in the k-space which extend perpendicularly to the data lines obtained by way of the first sequence. The samples of the magnetic resonance signals obtained by way of the second sequence are stored in a second data set.

Figure 2B:
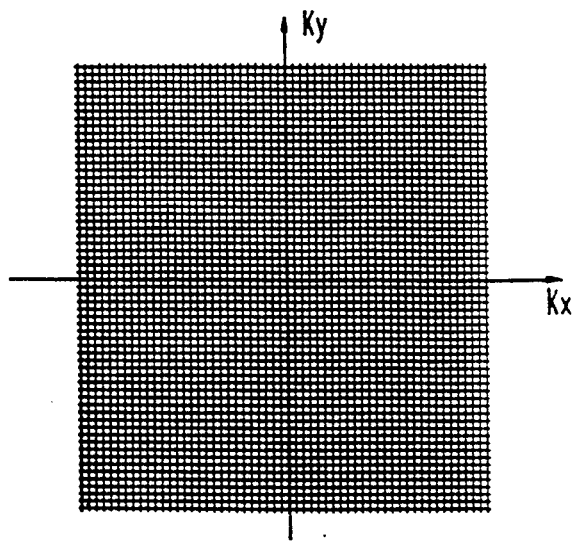
FIG. 2C shows formulae for a first version as shown in FIG. 2A.
FIG. 2D shows formulae for a second version as shown in FIG. 2A.

FIG. 2B shows intersecting lines in the k-space associated with the sequences shown in FIG. 2A. In the present example concerning two-dimensional imaging, the Fourier transform F of the nuclear spin density function $P_o(x,y)$ is plotted along the axes $k_x$ and $k_y$ in the k-space. The invention will be described hereinafter in terms of a so-called k-trajectory description. The essence of the k-trajectory description consists in that gradients varying in time map the space-frequency domain contents of the object directly on the magnetic resonance signal S(t).

$$S(t) = \int_V e^{-t/T2} \cdot f(x) \cdot e^{-i2\pi k(t) \cdot x} \cdot dx$$

where $$k(t) = \gamma \int_0^t \frac{dB(t')}{dx} \cdot dt'$$

k(t) is the integral of the gradients, or also the vector of the space-frequency coordinates, i.e. $S(t) \approx F[k(t)]$, where F is the Fourier transform of f(x), being the magnetic resonance distribution of the object. Furthermore, in the above formulas $i = \sqrt{-1}$, x is a two-dimensional or three-dimensional set of spatial coordinates in the form of a vector, $\gamma$ is the so-called gyromagnetic ratio, $T_2$ is the transverse relaxation time, and B is the strength of the magnetic field. S(t) is to be considered as a weighted (and disturbed by noise) observation of the spatial frequency distribution F[k(t)] corresponding to the object. In magnetic resonance imaging the encoding process of nuclear spins then consists of sampling along a set of trajectories determined by gradients which vary in time, the decoding process consisting of the transformation of said samples in the k-space into a discrete image which is an estimate of the original spatial distribution. If the pulse and gradient sequence is associated with a so-called Fourier zeugmatography method, a succession of different gradients can be considered as an "excursion" in the $k_x k_y$ plane at a speed which is determined by the instantaneous value of the gradient G, via the relation $dk/dt = G$ ($k_x = \gamma \cdot G_x \cdot t$ for a constant measuring gradient), the instantaneous value of S(t) producing the F value in the point reached in the $k_x k_y$ plane. Fourier transformation of the samples in the k-space produces a nuclear spin magnetization distribution of the object. The samples, plotted on a rectangular grid in the k-space, are to be considered as data values of a discrete Fourier domain image and the discrete space domain image can be obtained by subjecting the Fourier domain image to a 2D-FT or 3D-FT. If the samples do not coincide with the grid points in the k-space (as is the case for a so-called echo-planar pulse and gradient sequence), an interpolation method of some kind should be applied to ensure that F(k) is estimated for grid points before execution of the discrete FT.

FIG. 2C shows formules for a first version as shown in FIG. 2A, in which the described sequences ps1 and ps2 have produced a first and a second data set, mapped on the k-space, as indicated in FIG. 2B. This version is suitable to reduce image errors caused by rigid motion. Such rigid motion can occur in MR imaging of extremeties of a living object, for example in the case of imaging of the knee of a human object where the object still performs motions despite the use of strapping means. In such a case not every data line will contain data originating from the object in its original position. The data lines will generally contain also data from an object which has been shifted through ($\delta_x$, $\delta_y$) pixels with respect to its original position. The shift is, of course, unknown a priori and can vary from one data line to another. In the version shown it is assumed that either a water component or a fat component has been presaturated in known manner and that inhomogeneities of the steady field are negligibly small. It has also been assumed that the position of the object is considered to be fixed during the sampling of one data line, so that in the first data set $\delta_x$ and $\delta_y$ do not depend on $k_x$, but exclusively on $k_y$. Even though the programmed means become slightly more complex if these assumptions are not valid, they correspond in principle to the described method. Similarly, it holds for the second data set that the error depends only on $k_x$. The respective shifts are designated as $\delta_x^A(k_y)$ and $\delta_y^A(k_y)$ for the first data set A and as $\delta_x^B(k_x)$ and $\delta_y^B(k_x)$ for the second data set B. Without prejudice to the universality of the method in accordance with the invention, it is assumed, by way of example that the number of phase encoding steps $n_a$, and hence the number of data lines, in the pulse and gradient sequence ps1 is equal to the number of phase encoding steps $n_b$ in the pulse and gradient sequence ps2, and also that the number of samples or frequency encoding steps $n_s$ is equal to the number of phase encoding steps per data set. Furthermore, the phase encoding steps in the sequences ps1 and ps2 should be chosen so that the sample i of the data line j of the first data set A corresponds to the sample j of the data line i of the data set B in order to obtain corresponding data at points of intersection of data lines in the k-space. In the present example there are in that case $(n_a+n_b) \cdot n_s$ equations with $n_s^2+n_a+n_b$ unknowns (i.e. $n_s^2$ unknowns in the actual image data and $(n_a+n_b)$ unknown errors in the data lines of the data sets). In the method in accordance with the invention first the errors in the data lines are determined and the data lines are corrected on the basis thereof. It is to be noted that in principle a double total acquisition time is used, but the images obtained by the invention are far better than in the case of simple averaging of two equal data sets. If the object 5 were completely in rest, corresponding data in the first and second data set A and B would be equal, the "ideal" data $S_O(k_x,k_y)$. However, in the case of rigid motion, the respective actual data $S_A(k_x,k_y)$ and $S_B(k_x,k_y)$ is given by the formulas [1] and [2] in FIG. 2C. In accordance with the invention, actual data $S_A$ and $S_B$ is corrected on the basis of estimates of the data line shifts so that they become approximately equal to one another and to $S_o$. First the complex data are divided by one another at grid points in the k-space, as expressed in the formula [3] in which * represents the complex conjugate. For small shifts in the order of magnitude of one pixel, the e-power therein may be approximated by the first two terms of the power series development thereof, so that formula [4] is obtained by taking the imaginary part of the approximation. On the basis thereof quantities $H_x(k_x,k_y)$ and $H_y(k_x,k_y)$ are defined in the respective formulas [5] and [6], which quantities define, as appears from the formula [4], difference shifts of the object 5 associated with the data lines of the data sets A and B in the x-direction and the y-direction, respectively, assuming that each time one of the difference shifts is zero. In the formulas [5] and [6] the letter $\epsilon$ represents a small number in order to prevent division by zero in the method, for example $\epsilon=0.5$. On the basis of these defined quantities and on the basis of the formula [4] there are determined estimates for the respective shifts $\epsilon$ of the object 5 associated with the data lines of the data sets A and B, as indicated in the formulas [7] to [10] where $\sim$ designates the estimate or approximation. As an approximation for $\delta_x^A(k_y)$ with the definition $H_x$ and the approximation according to the formula [4], via the formula [11] and [12], the expression according to the formula [13] is used, the formula [12] following from the formula [11] assuming that $k_x^2/(k_x^2+\epsilon) \approx 1$ and that $k_x$ has a symmetrical range of values, whilst the formula [13] follows from the formula [12] assuming that the second term in the formula [12] is large, in an absolute sense, relative to the other terms. In a first approximation the latter approach is justified because the first and the third term in the formula [12] contain an incoherent random variable and relate as $\sqrt{n_s}$ to $n_s$ relative to the second term. The last term in the formula [12] is zero because of the assumption of the symmetrical range of values for $k_x$. When estimates for the other shifts $\delta$ are determined in a similar manner, the data values $S_A$ and $S_B$ can be corrected for by means of formulas [14] and [15]. If the approximations according to the formulas [14] and [15] are still too far remote from $S_O$, the approximation process can be repeated. After a number of iterations, typically from 1 to 4 iterations, a magnetic resonance image can be reconstructed from the corrected data $S_A^{(n)}$, $S_B^{(n)}$ or $(S_A^{(n)}+S_B^{(n)})/2$, where n designates the number of iterations. The described method can be adapted so as to take into account uncertainty invoked by noise. As appears from the formula [16], estimates are then weighted by a weighting factor $w(k_x,k_y)$. Formula [17] shows a weighting factor which is to be preferred, because the error in the estimates due to noise is thus minimized. In formula [17] $N^2$ is the variance of the noise in the data.

FIG. 2D shows formulas for a second version of FIG. 2A, in which the described sequences ps1 and ps2 are used to obtain a first and a second data set, mapped on the k-space, as shown in FIG. 2B. This version is suitable to reduce image errors caused by non-rigid motion, for example respiratory motion of a living object 5. For example, transverse images can be made of the thoracic region of a living object 5. In the thoracic region the motion is mainly anterior-posterior, and the motion can be modelled as a linear stretching or compression, i.e. it is assumed that locally the tissue is displaced over a distance c.y in the y-direction, where c is a stretching factor that will differ from one data line to another. Making assumptions as regards the magnitude of the data sets as in the first version in accordance with FIG. 2C the following holds good. In formula [18] of FIG. 2D the "ideal" signal $S_O(k_x,k_y)$ is given and in formula [19] the signal distorted due to stretching of the object is given, i.e. the distorted data of the first data set A. For small distortions the first e-power in the formula [19] can be approximated by the first two terms of a power series development thereof, thus producing the formula [20]. The formula [20], written in terms of the convolution operator , produces the formula [21] in which $G(k_y)$ is the Fourier transform of the function $2\pi y/n_s$, said Fourier transform being shown in the Formula [22]. Similarly, formula [23] provides an approximation of the distorted data of the second data set B. In the second version the distorted $S_A$ and $S_B$ should be corrected so that they approximate the "ideal" signal $S_O$ as well as possible. Like in the first version, a quantity $H(k_x,k_y)$ is defined in the formula [24] on the basis of the formulas [21] and [23], where $S_O(k_x,k_y)$ is in first instance approximated by $(S_A+S_B)/2$. It can be simply demonstrated that $H(k_x,k_y)$ is approximately equal to the form shown in the formula [25], being an expression in the stretching factors $c^A$ and $c^B$. If it can be assumed that the stretching is more or less random between the data lines, as may be assumed for motion due to respiration, the stretching factors can be estimated as indicated in the formulas [26] and [27] the data can be corrected by way of the estimates found. When noise and other uncertainties are also taken into account, the method in accordance with the invention can be slightly adapted as shown in the formulas [28] to [34] in which $w(k_x,k_y)$ is a weighting factor as in the first version. In order to limit the duration of the convolution, it is permissible to take only the first four to six largest elements of $G(k_y)$. Even though the method becomes slightly more complex if errors are caused by more complex patterns of motion, for example due to rotation of the head in transversal images of the head of an impatient human object 5 or due to nonlinear stretching in the longitudinal direction (caudio-cranial direction) in saggital images of the abdomen, caused by respiration, images containing fewer image errors will nevertheless be obtained.

FIG. 3A shows a further version of pulse and gradient sequences of a method in accordance with the invention, comprising a first pulse and gradient sequence ps3 which comprises an excitation pulse ep3, a refocusing pulse rp3, a slice-selection gradient $G_z$, a phase encoding gradient $G_y$ and a measuring gradient $G_x$. The pulses ep3 and rp3 are applied at the instants t1 and t2, respectively, and the magnetic resonance signal is detected approximately at the instant t3. The sequence ps3 is repeated for a number of steps of the phase encoding gradient, for example 256 steps. Furthermore, a pulse and gradient sequence ps4 is shown, comprising an excitation pulse ep4 at the instant t1' and a refocusing pulse rp4 at the instant t2'. The sequence ps4 deviates from the sequence ps3 in that half the number of phase encoding steps is situated to one side of the k-space and in that a fixed, additional gradient $G_y$ is applied during the reading out of the magnetic resonance signal in each sequence ps4. As is shown in FIG. 3B, this method of scanning results in a pattern of intersecting data lines in the k-space in which the horizontal data lines are associated with the sequence ps3 while the oblique data lines are associated with the sequence ps4.

FIG. 3C shows intersecting data lines in the k-space associated with another version of a method in accordance with the invention. This pattern of data lines with associated data sets is obtained by means of two pulse and gradient sequences (not shown) which include, like customary sequences, a frequency encoding gradient, but in which phase encoding gradients are applied which are formed by the sum of $G_y$ and an additional gradient and by the difference between $G_y$ and the additional gradient, respectively, $G_y$ having a waveform as in customary sequences such as a customary spin-echo or spin-warp sequence. The additional gradient is also applied in the positive and the negative sense during the read-out gradient. Thus, a pattern of mutually perpendicularly intersecting data lines is obtained in the k-space, which data lines enclose respective angles of $+45°$ and $-45°$ with respect to the axes in the k-space. The sequences shown in the FIGS. 3A to 3C, do not give rise to problems due to time differences between corresponding samples as described in FIG. 2, which problems could arise due to inhomogeneities of the steady field or due to chemical shifts. In the sequences shown in FIG. 3A the time elapsing between excitation and sampling of a sample i is maintained constant for all data lines of both data sets. Estimation and correction formulas can be determined in an analogous manner.

Figure 4A:
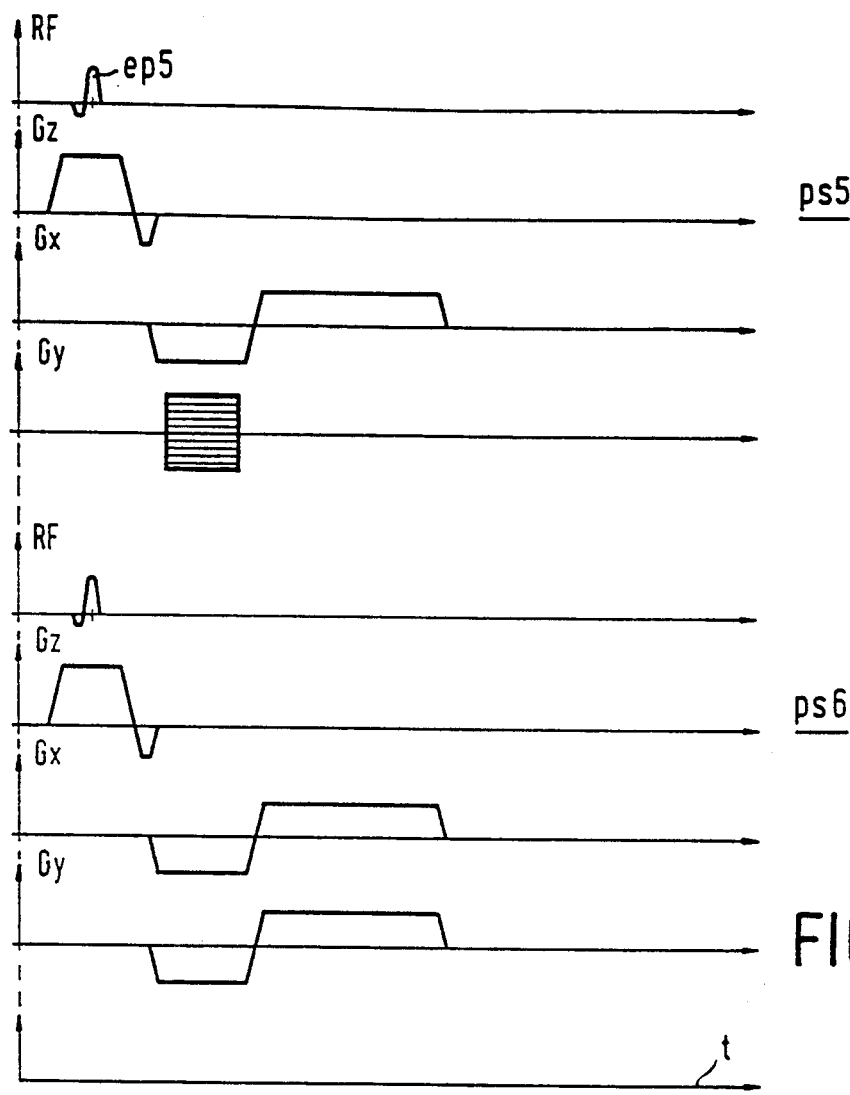
FIG. 4A shows a version of pulse and gradient sequences in accordance with the invention which is suitable for reducing image errors due to external fields.
Figure 4B:
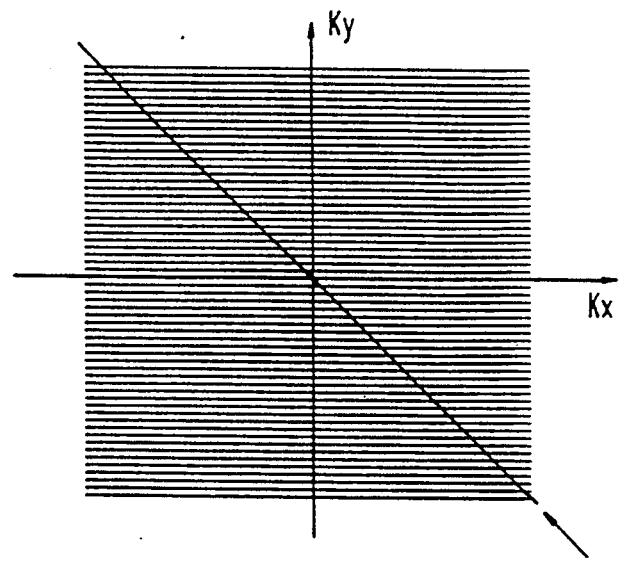
FIG. 4B shows intersecting data lines in the k-space, associated with the sequences shown in FIG. 4A.

FIG. 4A shows a version of pulse and gradient sequences in accordance with the invention which is suitable for reducing image errors due to external fields, for example from moving elevators in the vicinity of MRI equipment, passing street cars and the like. This Figure shows a pulse and gradient sequence ps5 which comprises an excitation pulse ep5 and gradients like in a known spin-warp or field-echo sequence, and also comprises a field-echo sequence ps6 which deviates from the sequence ep5 in that instead of a phase encoding gradient, like in the sequence ps5, a single gradient is applied which is equal to the gradient $G_x$ and which is applied simultaneously therewith, its gradient direction, however, being different. This results in a pattern of intersecting lines in the k-space as shown in FIG. 4B. A first data set A to be corrected contains the data of the horizontal data lines in FIG. 4B and the second data set B, used for correction, contains data of the oblique data line in FIG. 4B. It is assumed that the field disturbances are slow in relation to the acquisition time for one data line, but fast in relation to the overall acquisition time for obtaining data for a complete magnetic resonance image. The example shown relates to field-echo sequences on which the effect exerted by the field variations is greatest, but can also be used for other sequences such as, inter alia a spin-echo sequence (90°-180°-echo). In the field-echo sequence field disturbances of the steady field cause a frequency offset of the sampled data of a data line. Because it is assumed that the field is reasonably constant during acquisition of a data line, the error can be modelled as a linearly increasing phase error over the data line. If the acquisition time is short in comparison with the echo time, being the time elapsing between excitation and acquisition, the error can be approximated by a constant phase shift over the data line. In the present example the data set contains $n_A$ data lines, each with $n_S$ samples with $n_A = n_S$, and the data set B contains one data line with $n_S$ samples. The set B is set up so that in the "ideal" case $S_B(k_B)$ would contain the same signal as $S_A(k_B,k_B)$. For the aforesaid reasons it is ensured that the time elapsing between the excitation pulse ep5 and the sampling of $S_A(k_x,k_y)$ is equal to the time elapsing between the excitation pulse ep6 and the sampling of $S_B(k_x)$.

FIG. 4C shows formulas for the version of FIG. 4A, based on the assumption that ideally the signals $S_O(k_x,k_y)$ would arise. The formules [35] and [36] show the actual data detected due to said phase errors. Therein, $N_x$ is the number of samples and $t_{acq}$ is the acquisition time of the data line. The approach shown holds for small values of $t_{acq}$. As appears from formule [37], $\phi_B$ is corrected on the basis of the knowledge that the central sampling must be real, after which the entire data line B is corrected in accordance with formule [38]. Subsequently, the phase errors of all data lines of the data set A can be corrected by means of formule [39], said phase error estimates being used for phase correction of the data set A. The magnetic resonance image is reconstructed from the corrected data set A. The method in accordance with the invention can be further refined. For example, the estimated correction factors can be weighted in order to reduce the effect of noise. When the data set B comprises several data lines, the effect of noise can be further reduced by averaging the estimate of the phase errors. If some distance exists between the data lines in the k-space in the case where the data set B comprises several data lines, this fact can be used to estimate the linearly increasing phase error component. Due to physical inadequacies, it may be that the data line of the data set B has been shifted slightly in the k-space, so that $S_B(k_x)$ does not correspond exactly to $S_A(k_x,k_y)$ but rather to $S_A(k_x,k_y+\Delta)$. Generally, $\Delta$ will be a non-integer number smaller than one. In that case it is necessary to interpolate the value $S_B'(k_x-\Delta)$ from the neighbouring values $S_B(k_x)$ and $S_B(k_x-1)$ and the value $S_A'(k_x-\Delta,k_y)$ from $S_A(k_x,k_y)$ and $S_A(k_x-1,k_y)$. The phase error $\phi_A(k_y)$ is then calculated as the phase difference between $S_B'(k_x-\Delta)$ and $S_A'(k_x-\Delta,k_y)$.

Figure 5A:
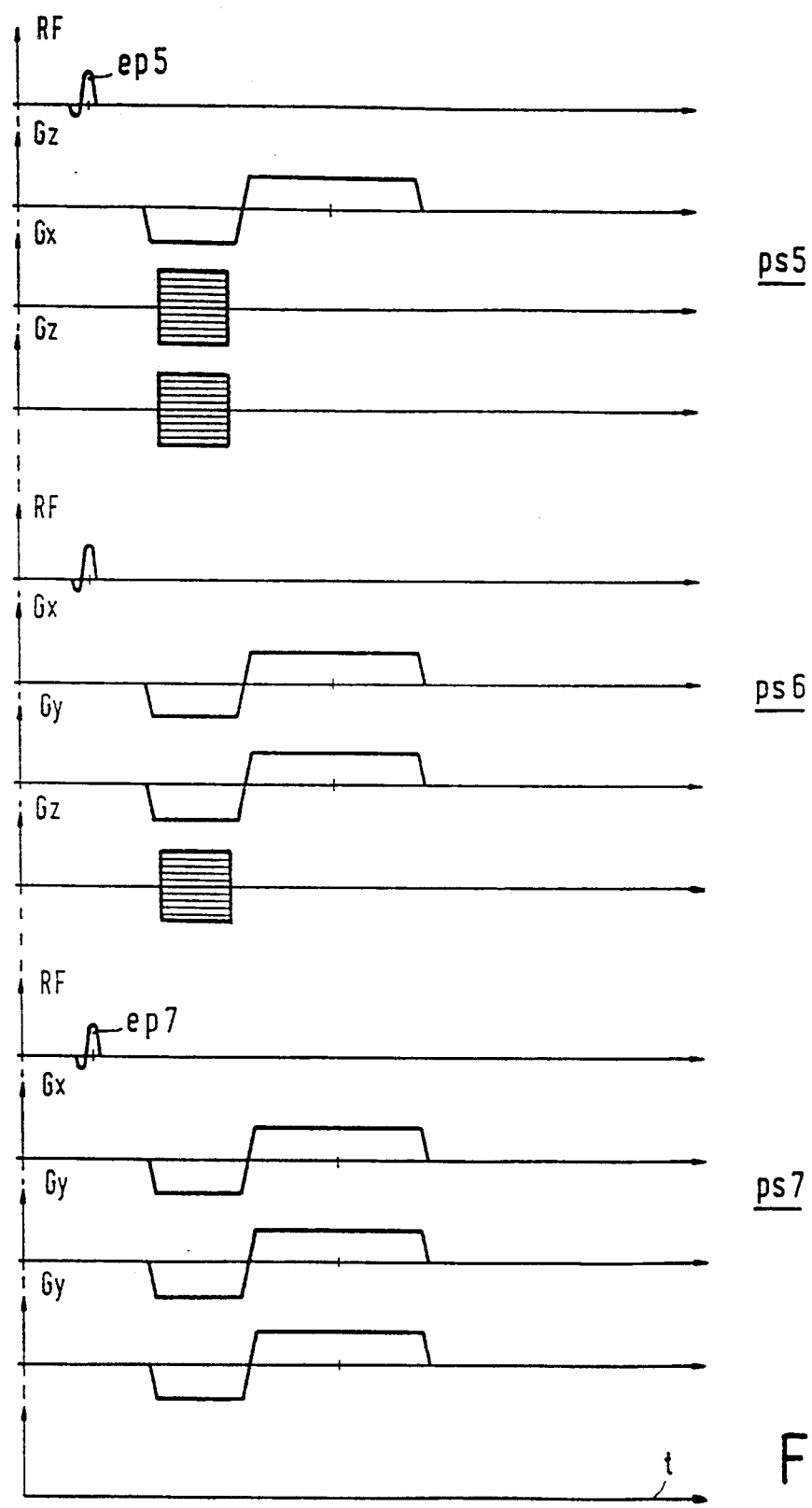
FIG. 5A shows pulse and gradient sequences for three-dimensional imaging in order to reduce image errors due to external fields.

FIG. 5A shows pulse and gradient sequences for three-dimensional imaging where image errors due to external fields are reduced, pulses and gradients which correspond to FIG. 4A being designated in a corresponding manner. In comparison with FIG. 4A there is provided a further pulse and gradient sequence ps7 with an excitation pulse ep7. The sequence ps5 comprises a further phase encoding gradient $G_z$, like the sequence ps6. The sequence ps7 comprises a read-out gradient $G_x$ and further gradients $G_y$ and $G_z$ which are coincident therewith. The gradient directions of the respective gradients in the sequence ps7 differ. The sequences ps5, ps6 and ps7 produce three data sets A, B and C of intersecting data lines in the k-space. The data set A is used to reconstruct the magnetic resonance image therefrom after correction, the "single-oblique" data set B and the "double-oblique" data set C being used for correction purposes. It is again assumed that the data is cubic and it is ensured that the time elapsing between excitation and sampling is the same for corresponding samples.

FIG. 5B shows formules for the three-dimensional version of FIG. 5A which are analogous to the formules shown in FIG. 4C. The formules [41] to [43] comprise approximated data and the formules [44] to [49] successively provide the estimation steps for $S_A$.

We claim:

1. A magnetic resonance imaging method for reducing image errors in a magnetic resonance image formed from magnetic resonance signals from an object arranged in a steady magnetic field, characterized in that magnetic resonance signals are acquired by means of at least first and second pulse and gradient sequences, signal samples thereof being stored in at least a first and a second data set, data lines of the respective data sets intersecting one another in the frequency domain, and that from a combination of data of the intersecting data lines estimates for image error sources are determined after which either on the basis of the estimates determined the data of the data lines in at least one of the data sets is corrected, after which the magnetic resonance image is determined from the corrected data set by means of an integral transformation or, using a Fourier transformation, a third data set is determined from one of the data sets and a fourth data set is determined from the estimates, after which the magnetic resonance image is determined by convolution of the third with the fourth data set.

2. A magnetic resonance imaging method as claimed in claim 1, characterized in that the first pulse and gradient sequence comprises an excitation pulse, a phase encoding gradient and a read-out gradient whose gradient directions do not coincide, the second pulse and gradient sequence, also comprising an excitation pulse, a phase encoding gradient and a read-out gradient, deviating from the first pulse and gradient sequence at least in that the phase encoding gradient and the read-out gradient have been interchanged.

3. A magnetic resonance imaging method as claimed in claim 2, characterized in that phase differences of data of the points of intersection of the data lines are used as the combination of data, object shifts associated with data lines being determined from said combination as estimates of the image error sources.

4. A magnetic resonance imaging method as claimed in claim 2, characterized in that phase differences of data of the points of intersection of the data lines are used as the combination of data, stretch factors of the object being derived from said combination as estimates of the image error sources.

5. A magnetic resonance imaging method as claimed in claim 2, 3, or 4, characterized in that a water or fat component of the object is presaturated prior to the acquisition of the magnetic resonance signals.

6. A magnetic resonance imaging method as claimed in claim 1, characterized in that the first pulse and gradient sequence comprises an excitation pulse, a phase encoding gradient and a read-out gradient whose gradient directions do not coincide, the second pulse and gradient sequence, also comprising an excitation pulse, a phase encoding gradient and a read-out gradient, deviating from the first pulse and gradient sequence at least in that the second pulse and gradient sequence comprises an additional phase encoding gradient which is applied simultaneously with the read-out gradient.

7. A magnetic resonance imaging method as claimed in claim 1, characterized in that the first pulse and gradient sequence comprises an excitation pulse, a phase encoding gradient and a read-out gradient whose gradient directions do not coincide, the second pulse and gradient sequence, also comprising an excitation pulse, a phase encoding gradient and a read-out gradient, deviating from the first pulse and gradient sequence at least in that an additional gradient is superposed on the phase encoding pulse of the first pulse and gradient sequence, which additional gradient is also applied during the read-out gradient, on the phase encoding gradient of the second pulse and gradient sequence there being superposed the opposed additional gradient which is also applied during the read-out gradient.

8. A magnetic resonance imaging method as claimed in claim 1, characterized in that the first pulse and gradient sequence comprises an excitation pulse, a phase encoding gradient and a read-out gradient whose gradient directions do not coincide, the second pulse and gradient sequence, also comprising an excitation pulse and a read-out gradient, deviating from the first pulse and gradient sequence at least in that a further gradient coincident with the read-out gradient is applied with a gradient direction which deviates from that of the read-out gradient, and that in the case of three-dimensional imaging further phase encoding gradients are applied in the first and second pulse and gradient sequences, a third pulse and gradient sequence being applied in order to obtain a third data set for estimation and correction, which third pulse and gradient sequence comprises an excitation pulse and three gradients which are active during the reading out of the magnetic resonance signal and whose gradient directions do not coincide.

9. A magnetic resonance imaging method as claimed in claim 8, characterized in that phases of data of the points of intersection of the data lines are taken as the combination of data, phases being successively estimated from said combination as estimates of the image error sources of the first and the second data set and data of the data lines being corrected on the basis of the estimated phases, and that in the case of three-dimensional imaging phases of the third data set are estimated, data of the data lines being corrected on the basis of the estimated phases.

10. A magnetic resonance imaging method as claimed in claim 9, characterized in that in the case of two-dimensional imaging the second data set comprises one data line and that in the case of three-dimensional imaging the third data set comprises one data line.

11. A magnetic resonance imaging method as claimed in claim 9, characterized in that in the case of two-dimensional imaging the second data set comprises several data lines and the estimates are determined by averaging phases thereof, and that in the case of three-dimensional imaging the third data set comprises several data lines and the estimates are determined by averaging phases thereof.

12. A magnetic resonance imaging method as claimed in claim 1, characterized in that the estimates are iteratively determined.

13. A magnetic resonance imaging method as claimed in claim 1, characterized in that the estimates are weighted in respect of noise.

14. A magnetic resonance imaging device for reducing image errors in a magnetic resonance image formed from magnetic resonance signals from an object arranged in a steady magnetic field, which device comprises means for generating the steady field, means for generating RF electromagnetic pulses, and means for gradient magnetic fields superposed on the steady field, characterized in that the device comprises programmed means for acquiring magnetic resonance signals from the object by means of at least first and second pulse and gradient sequences, signal samples of said signals being stored in at least a first and a second data set, data lines of the respective data sets intersecting one another in the frequency domain, the programmed means also being suitable for determining estimates of image error sources from a combination of data of the intersecting data lines and for subsequently correcting the data of the data lines in at least one of the data sets on the basis of the estimates determined, after which the magnetic resonance image is determined from the corrected data set by way of an integral transformation.

15. A magnetic resonance imaging method as claimed in claim 8, characterized in that in the case of two-dimensional imaging the second data set comprises one data line and that in the case of three-dimensional imaging the third data set comprises one data line.

16. A magnetic resonance imaging method as claimed in claim 8, characterized in that in the case of two dimensional imaging the second data set comprises several data lines and the estimates are determined by averaging phases thereof, and that in the case of three-dimensional imaging the third data set comprises several data lines and the estimates are determined by averaging phase thereof.

* * * * *